(12) United States Patent
Venkataraman et al.

(10) Patent No.: US 8,012,887 B2
(45) Date of Patent: Sep. 6, 2011

(54) PRECURSOR ADDITION TO SILICON OXIDE CVD FOR IMPROVED LOW TEMPERATURE GAPFILL

(75) Inventors: Shankar Venkataraman, Santa Clara, CA (US); Hiroshi Hamana, Hyogo (JP); Manuel A. Hernandez, Santa Clara, CA (US); Nitin K. Ingle, Santa Clara, CA (US); Paul Edward Gee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 12/489,234

(22) Filed: Jun. 22, 2009

(65) Prior Publication Data

US 2010/0159711 A1    Jun. 24, 2010

Related U.S. Application Data

(60) Provisional application No. 61/138,864, filed on Dec. 18, 2008.

(51) Int. Cl.
*H01L 21/31* (2006.01)
*C23C 16/00* (2006.01)

(52) U.S. Cl. .................. 438/780; 427/255.37

(58) Field of Classification Search .................. 438/780; 427/257.27, 255.37
See application file for complete search history.

(56) References Cited

U.S. PATENT DOCUMENTS

| | | | |
|---|---|---|---|
| 6,583,048 B1 * | 6/2003 | Vincent et al. | 438/623 |
| 6,596,654 B1 | 7/2003 | Bayman et al. | |
| 6,727,190 B2 * | 4/2004 | Srinivasan et al. | 438/789 |
| 6,905,940 B2 | 6/2005 | Ingle et al. | |
| 7,087,536 B2 | 8/2006 | Nemani et al. | |
| 7,456,116 B2 | 11/2008 | Ingle et al. | |
| 2002/0017641 A1 * | 2/2002 | Lu et al. | 257/3 |
| 2002/0090834 A1 | 7/2002 | Lee et al. | |

OTHER PUBLICATIONS

French, P.J. et al., "Low-temperature BPSG Reflow Compatible with Surface Micromachining," J. Micromech, Microeng. 5 (1995) 125-127.
PCT International Search Report and Written Opinion mailed Jun. 29, 2010; International Application No. PCT/US2009/065181, 10 pages.

* cited by examiner

*Primary Examiner* — William D Coleman
(74) *Attorney, Agent, or Firm* — Kilpatrick Townsend & Stockton LLP

(57) ABSTRACT

Methods of depositing silicon oxide layers on substrates involve flowing a silicon-containing precursor, an oxidizing gas, water and an additive precursor into a processing chamber such that a uniform silicon oxide growth rate is achieved across the substrate surface. The surface of silicon oxide layers grown according to embodiments may have a reduced roughness when grown with the additive precursor. In other aspects of the disclosure, silicon oxide layers are deposited on a patterned substrate with trenches on the surface by flowing a silicon-containing precursor, an oxidizing gas, water and an additive precursor into a processing chamber such that the trenches are filled with a reduced quantity and/or size of voids within the silicon oxide filler material.

29 Claims, 6 Drawing Sheets

PRECURSOR ADDITION TO SILICON OXIDE CVD FOR IMPROVED LOW TEMPERATURE GAPFILL

CROSS-REFERENCES TO RELATED APPLICATIONS

This application claims the benefit of U.S. Provisional Application No. 61/138,864 by Venkataraman et al, filed Dec. 19, 2008 and titled "PRECURSOR ADDITION TO SILICON OXIDE CVD FOR IMPROVED LOW TEMPERATURE GAPFILL" which is incorporated herein in its entirety for all purposes.

FIELD

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

The fabrication sequence of integrated circuits often includes several patterning processes. The patterning processes may be used to define a layer of conducting features which may be formed in metal, polysilicon or doped silicon. Thereafter, electrically isolating structures may be formed by depositing dielectric material on the patterned layer which includes trenches located between electrically active regions. The dielectric material provides electrical isolation within the plane of deposition but also between vertically separated layers of conducting features.

A challenge associated with the formation of sub-micron devices is filling a narrow trench in a void-free manner. To fill a trench with silicon oxide, a layer of silicon oxide is first deposited on the patterned substrate. The silicon oxide layer typically covers the field, as well as walls and bottom of the trench. If the trench is wide and shallow, it is relatively easy to completely fill the trench. As the trench gets narrower and the aspect ratio (the ratio of the trench height to the trench width) increases, it becomes more likely that the opening of the trench will be closed (or "pinched off") before the trench is completely filled.

Pinching off a trench may trap a void within the trench. Under certain conditions, the void will be filled during a reflow process, for example where the deposited silicon oxide is doped and experiences viscous flow at elevated temperatures. However, as the trench becomes narrower, even reflow processes may have difficulty filling the void. Moreover, several types of applications call for the deposition of lightly or undoped silicon oxide, which can be difficult to reflow even at an elevated temperature. Voids resulting from pinching-off are undesirable as they can reduce the performance and yield of good chips per wafer as well as the reliability of the devices.

Flowing TEOS and Ozone ($O_3$) to a processing chamber is a technique used to create a silicon oxide film which can fill high aspect ratio trenches well due to the high initial mobility on the substrate. Trenches can be filled without voids at relatively high substrate temperatures (above 600° C.). Additives may be used such as water vapor to further reduce the initial viscosity of the film thereby reducing or eliminating the need to reflow the film in a subsequent step. Using similar precursors at lower substrate temperatures results in spatially varying film growth rates. Film growth rate irregularities can act to trap voids within a trench thereby reducing the benefits of using a TEOS/Ozone process.

Therefore, it is desirable to be able to fill narrow trenches with silicon oxide films at lower temperatures without leaving voids.

BRIEF SUMMARY OF THE INVENTION

Aspects of the disclosure pertain to methods of depositing silicon oxide layers on substrates. In embodiments, silicon oxide layers are deposited by flowing a silicon-containing precursor, an oxidizing gas, water and an additive precursor into a processing chamber such that a uniform silicon oxide growth rate is achieved across the substrate surface. The surface of silicon oxide layers grown according to embodiments may have a reduced roughness when grown with the additive precursor. In other aspects of the disclosure, silicon oxide layers are deposited on a patterned substrate with trenches on the surface by flowing a silicon-containing precursor, an oxidizing gas, water and an additive precursor into a processing chamber such that the trenches are filled with a reduced quantity and/or size of voids within the silicon oxide filler material.

In one embodiment, the present disclosure provides a method for forming a silicon oxide layer on a substrate in a processing chamber. The method includes flowing a silicon-containing precursor and flowing an oxidizing gas into the processing chamber. The method further includes flowing water and an additive precursor into the processing chamber. The silicon oxide layer is formed on the substrate from the silicon-containing precursor, the oxidizing gas, water and the additive precursor by chemical vapor deposition. The additive precursor promotes a uniform growth rate of the silicon oxide layer across the substrate and reduces roughness of the silicon oxide layer.

In another embodiment, the present disclosure provides a method for filling a trench with silicon oxide. The trench is on a substrate within a processing chamber. The method includes flowing a first silicon-containing precursor into the processing chamber. The first silicon-containing precursor comprises at least one Si—O bond. The method further includes flowing an oxidizing precursor, water and a second silicon-containing precursor into the chamber. The second silicon-containing precursor comprises at least one Si—C bond. The method further includes depositing the silicon oxide in the trench with the first and second silicon-containing precursors and the oxidizing precursor by chemical vapor deposition. The second precursor evens out a growth rate, thereby reducing a size of voids and/or a number of voids which remain in the trench following deposition.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Aspects of the disclosure pertain to methods of depositing silicon oxide layers on substrates. In embodiments, silicon oxide layers are deposited by flowing a silicon-containing precursor, an oxidizing gas, water and an additive precursor into a processing chamber such that a uniform silicon oxide growth rate is achieved across the substrate surface. The surface of silicon oxide layers grown according to embodiments may have a reduced roughness when grown with the additive precursor. In other aspects of the disclosure, silicon oxide layers are deposited on a patterned substrate with trenches on the surface by flowing a silicon-containing precursor, an oxidizing gas, water and an additive precursor into a processing chamber such that the trenches are filled with a reduced quantity and/or size of voids within the silicon oxide filler material.

Embodiments of the invention are directed to methods of forming silicon oxide in trenches on a patterned surface of a substrate. An additive precursor is flowed into the processing chamber during the formation of the film to facilitate a spatially uniform growth rate. Sub-atmospheric CVD (SACVD) and related processes involve flowing a silicon-containing precursor and an oxidizing precursor into a processing chamber to form silicon oxide on the substrate. The silicon-containing precursor may include TEOS and the oxidizing precursor may include ozone ($O_3$), oxygen ($O_2$) and/or oxygen radicals. Another precursor, e.g. water vapor, may be added to the processing chamber to enhance the flowability of material on the substrate. Silicon oxide films grown from TEOS and ozone precursors on substrates below about 600° C. have been found to have rough surfaces which can be seen with a variety of surface imaging techniques, such as atomic force microscopy. The addition of the additive precursor, e.g. HMDS or TMDSO, has been found to result in less surface roughness following deposition.

Figure 1:
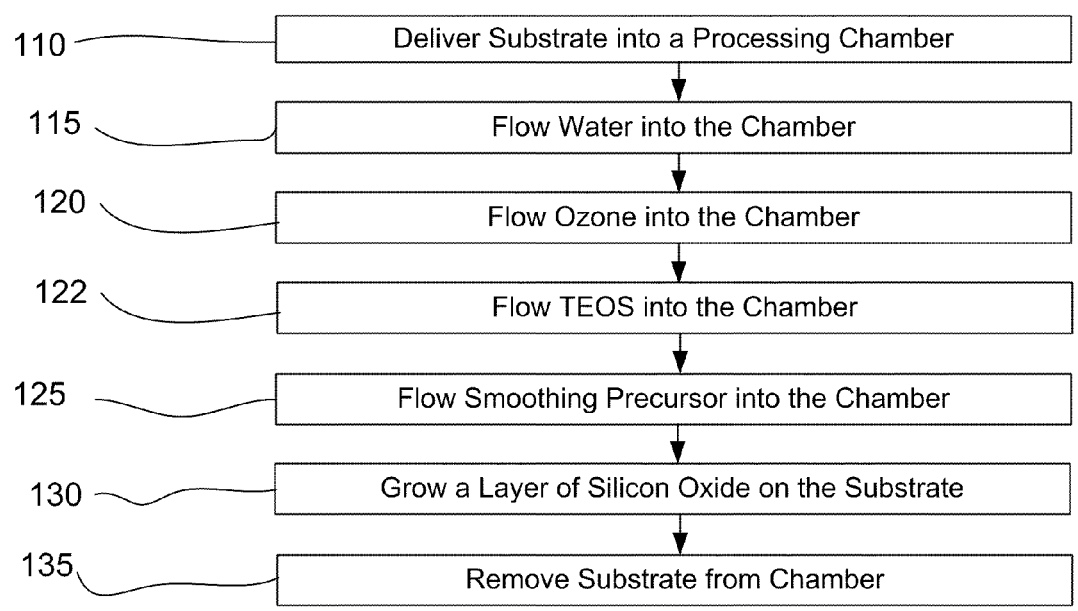
FIG. 1 is a flow chart of a silicon oxide gapfill deposition process according to disclosed embodiments.

In order to better understand and appreciate the invention, reference is now made to FIG. 1 which is a flow chart of a silicon oxide gapfill deposition process according to disclosed embodiments and Table I which contains surface roughness measurements taken after deposition. The process begins when a substrate is transferred into a processing chamber (operation 110). $H_2O$, ozone and TEOS are flowed into the chamber in operations 115, 120 and 122. During the flow of those precursors, an additive precursor (e.g. TMDSO, HMDS or a combination thereof) is flowed into the chamber (operation 125) to facilitate uniform growth of a silicon oxide layer on a substrate in operation 130. Following the growth of the film, the substrate is removed from the chamber in operation 135.

During preparation of films analyzed for Table I, the flow rate of TEOS was about 3 grams per minute and the flow rate of ozone was about 30,000 sccm. Steam ($H_2O$) was flowed during the growth of the film at a rate near 4000 sccm and TMDSO was flowed at essentially constant rates of about 0 mg/min, 75 mg/min, 150 mg/min, 300 mg/min and 700 mg/min. Substantially inert carrier gases (He and $N_2$) were used to assist in delivery of TMDSO, $H_2O$ and TEOS into the chamber. The magnitude of carrier gas flow rates is typically given in standard cubic centimeters per minute (sccms). The magnitude of the mass flow of the gas carried by the carrier gas is typically given in mg/min which does not include the mass flow of the carrier gas. Roughness can be measured in many ways. Roughness quantities recited herein are given for a two dimensional AFM measurement made on a 5 μm×5 μm portion of the surface of a silicon oxide film. A Dimension 7000 AFM available from Veeco of Plainview, N.Y. was used with a measurement point density higher than or about $10^4$/μm and a commensurate resolution tip operated in tapping mode.

Flow rates, as used herein, are not necessarily constant during the process. Flow rates of the different precursors may be initiated and terminated in different orders and their magnitudes may be varied. Unless otherwise indicated, mass flow rate magnitudes indicated herein are given for the approximate peak flow rate used during the process. The flow rate of TMDSO correlates with the reduction of roughness of the silicon oxide film during and after deposition.

TABLE I

Dependence of Silicon Oxide roughness on Additive Precursor flow rate

| TMDSO (mg/min) | Roughness rms (nm) |
|---|---|
| 0 | 15.08 |
| 75 | 7.39 |
| 150 | 3.50 |
| 300 | 1.82 |
| 700 | 0.91 |

Flow rate magnitudes indicated herein are for deposition on one side of a single 300 mm diameter wafer (area approximately 700 $cm^2$). Appropriate correction based on deposition area is needed for multiple wafers, larger or smaller wafers, double sided deposition or deposition on alternative geometry substrates (e.g. rectangular substrates).

Growing silicon oxide films with the assistance of an additive precursor such as TMDSO and/or HMDS increases the conformality of the deposition which has implications for the deposition of silicon oxide on patterned surfaces which will be explained later. Forming such films on blanket wafers provides utility as well and provides insights into the general nature of films grown with the additive precursor. The reduction of the roughness of the surface of the growing film reduces the formation of voids in silicon oxide films formed on unpatterned substrates. The reduction in voids (size and/or population) results in a denser film and has been found to result in a reduction in wet etch rate (WER) as well as an increase in refractive index (RI).

Figure 2:
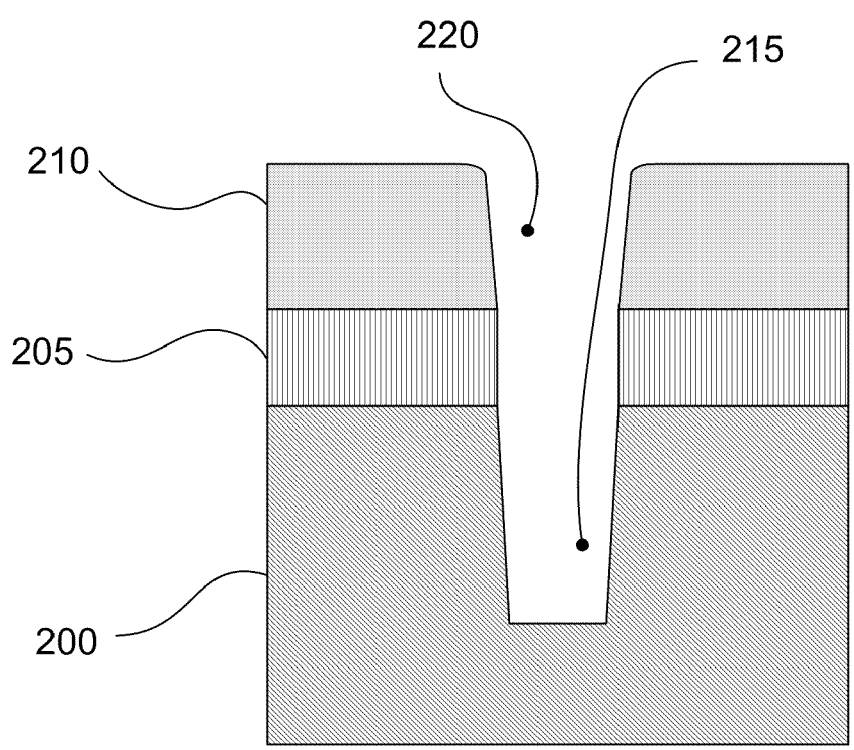
FIG. 2 is a cross-sectional view of a trench prior to depositing silicon oxide according to disclosed embodiments.

The processes of FIG. 1 may also be used to more completely fill trenches with silicon oxide due to the more even growth rate. TEOS-ozone processes conducted on relatively low temperature substrates without the additive precursor may result in trapped voids because of the uneven growth rates, sometimes referred to as "fingering" or "mushrooming." FIG. 2 is a cross-sectional view of a trench prior to depositing silicon oxide according to disclosed embodiments. The trench depicted is formed in silicon 200, silicon oxide 205 and silicon nitride 210 consistent with a shallow trench isolation (STI) process which is an exemplary application of methods disclosed herein.

A TEOS-ozone silicon oxide growth process results in a shorter latency film growth on silicon 200 and silicon oxide 205 than it does on silicon nitride 210. A shorter latency or low-latency film growth is one which starts more quickly than a high-latency film growth. Latency describes a delay between the initiation of the flow of precursors and the beginning of a high rate of film growth. Latency may result from a need to create an initiation layer or nucleation sites prior to the acceleration of the growth rate. Variations in latency are common among different underlying materials. At high substrate temperatures, the difference in latency retards the silicon oxide growth in the shallow trench region 220 which allows the deep trench region 215 to be filled more completely. On the other hand, the same process on a low temperature substrate may trap voids in the deep trench region 215 due to the mushrooming growth behavior regardless of the size of the opening in the shallow trench region 220.

Depositing silicon oxide in a trench on a low temperature substrate results in fewer voids when the flows of TEOS and ozone (and water vapor, if implemented) are accompanied by a flow of an additive precursor. The growth rate of the silicon oxide, e.g. in the deep trench region 215, is more even allowing the film growth to proceed while forming fewer and/or smaller voids. The deep trench region 215 is filled with silicon oxide and following the latent period associated with growth on silicon nitride, the growth rate thereon increases and the remainder of the shallow trench region 220 is filled.

Regardless of underlying material differences, a flow rate of an additive precursor accompanying the other precursors may improve the fill by decreasing the quantity and/or size of voids incorporated in a trench. In the case of 300 mm wafers or substrates of similar area, additive precursor flow rates may be above or about 1 mg/min, above or about 5 mg/min, above or about 10 mg/min, above or about 25 mg/min, above or about 50 mg/min or above or about 100 mg/min, above or about 150 mg/min, above or about 200 mg/min, above or about 300 mg/min or above or about 500 mg/min at some point during the flow of precursors in different embodiments.

Figure 3:
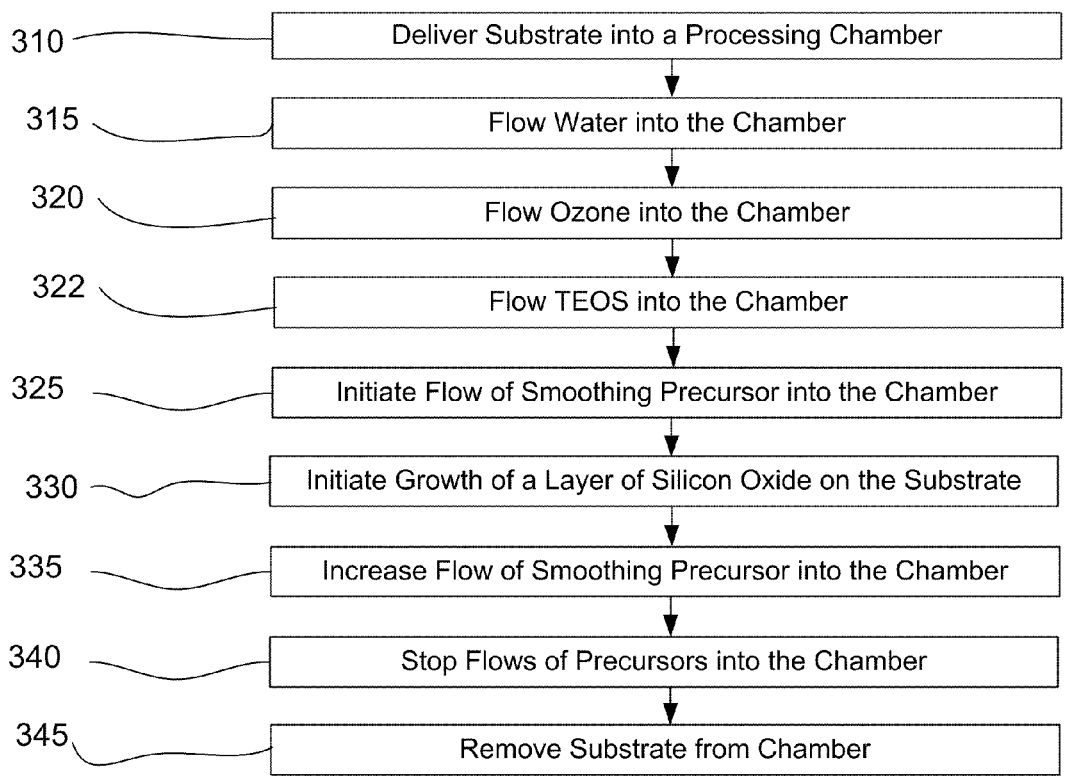
FIG. 3 is a flow chart of a silicon oxide gapfill deposition process according to disclosed embodiments.

Inclusion of an additive precursor in a TEOS-ozone-water vapor process has been found to reduce the roughness of the growing film but also reduces the surface flowability of the deposited material. Since a higher rate of surface flow helps fill deep trenches, the flow rate of the additive precursor may be ramped or otherwise increased during the deposition. FIG. 3 shows this type of process flow. The substrate is delivered (operation 310) to the processing chamber. Flows of water, ozone and TEOS begin in operations 315, 320 and 322. A flow of the additive precursor is begun in operation 325 at a relatively low flow rate. After film growth is initiated (operation 330), the flow is increased either abruptly at one or more relatively discrete times or gradually during the deposition (operation 335). The flows of precursors are stopped and the substrate is removed from the chamber (operations 340 and 345).

One or more abrupt increases in the flow rate of the additive precursor may be conducted at specific times during the deposition. A low flow rate may be maintained early in the process (e.g. low flow rates may be above or about 1 mg/min, above or about 5 mg/min, above or about 10 mg/min, above or about 20 mg/min or above or about 50 mg/min in different embodiments) for an early stage of growth of the film. These low flow rates result in a less smooth film but also a less conformal film growth process. A less conformal film growth process avoids the formation of a strong seam in the middle of vias.

Once a portion of the trenches on the substrate are filled, the flow rate may be increased to further decrease the roughness of the growing film. The growth becomes more conformal but seams are still reduced due to the initial non-conformal growth. A high flow rate maintained later in the growth process may be above or about 10 mg/min, 25 mg/min, 50 mg/min, above or about 100 mg/min, above or about 150 mg/min, above or about 200 mg/min, above or about 300 mg/min or above or about 500 mg/min in different embodiments. Measurements indicate that a lower flow rate of HMDS may be used to achieve similar results to TMDSO. However, surface materials and surface conditions have been found to affect the efficacy of additive precursors. The increasing flow rate may result in a higher refractive index and a lower wet etch rate for a portion of the silicon oxide film grown later in the film growth process.

A gradual increase in the flow rate of the additive precursor is an effective alternative to one or more abrupt increases. Ramp initiation flow rates may be above or about 1 mg/min, above or about 5 mg/min, above or about 10 mg/min, above or about 20 mg/min or above or about 50 mg/min in different embodiments early in the process. Increasing flow rate during the ramp may actually involve a sequence of relatively small but discrete increases in flow rate resulting in a stairway shape of flow rate vs. time. The average rate of increase may be variable or constant. The ramp termination flow rate may be above or about 10 mg/min, 25 mg/min, 50 mg/min, above or about 100 mg/min, above or about 150 mg/min, above or about 200 mg/min, above or about 300 mg/min or above or about 500 mg/min in different embodiments. An exemplary ramp may involve increasing the flow of TMDSO from 30 mg/min to 150 mg/min at an average ramp rate of 1 mg/(min-sec) while a corresponding exemplary ramp for HMDS may involve increasing the flow from 10 mg/min to 50 mg/min at an average ramp rate of 0.33 mg/(min-sec). Alternative average linear ramp rates may be calculated based on ramp duration, ramp initiation flow rate and ramp termination flow rate.

The additive precursor may be a variety of precursors which chemically interact with the substrate and have less site-selectivity than the silicon-containing precursor (often TEOS). At low substrate temperatures, film growth with less or no additive precursor results in preferential growth sites due, possibly, to increased reaction probabilities near nucleation sites. Descriptions of chemical mechanisms contained herein may be helpful in understanding embodiments of the invention but are not necessarily correct nor are they intended to limit the scope of the claims. In some embodiments, additive precursors may comprise a Si—C bond which appears to lessen site-selectivity resulting in a more uniform silicon oxide growth rate when combined with the silicon-containing precursor and the oxidizing precursor. An additive precursor may be tetramethyldisiloxane (TMDSO) or hexamethyldisilazane (HMDS) or another precursor containing at least one Si—C bond in different embodiments.

The flow rates of an additive precursor and a silicon-containing precursor (e.g. TEOS) may both be increased during the growth of a silicon oxide layer. The slower and smoother growth rates near the beginning of filling a trench on a patterned wafer further improve the ability to more completely fill the trench. Following the complete or partial filling of the trench, the flow rate of the additive precursor can be increased to smooth the growing film while the silicon-containing precursor may be increased to increase the growth rate of the film.

Upper bounds on the substrate temperature during deposition may be below or about 600° C., below or about 540° C., below or about 500° C., below or about 400° C., below or about 350° C. or below or about 300° C. in different embodiments. Lower bounds on the substrate temperature during deposition may be above or about 100° C., above or about 150° C., above or about 200° C. or above or about 300° C. in different embodiments. Each of the lower bounds may be combined with any of the upper bounds on the substrate temperature to form additional ranges on the substrate temperature according to additional disclosed embodiments.

Exemplary Substrate Processing System

Figure 4A:
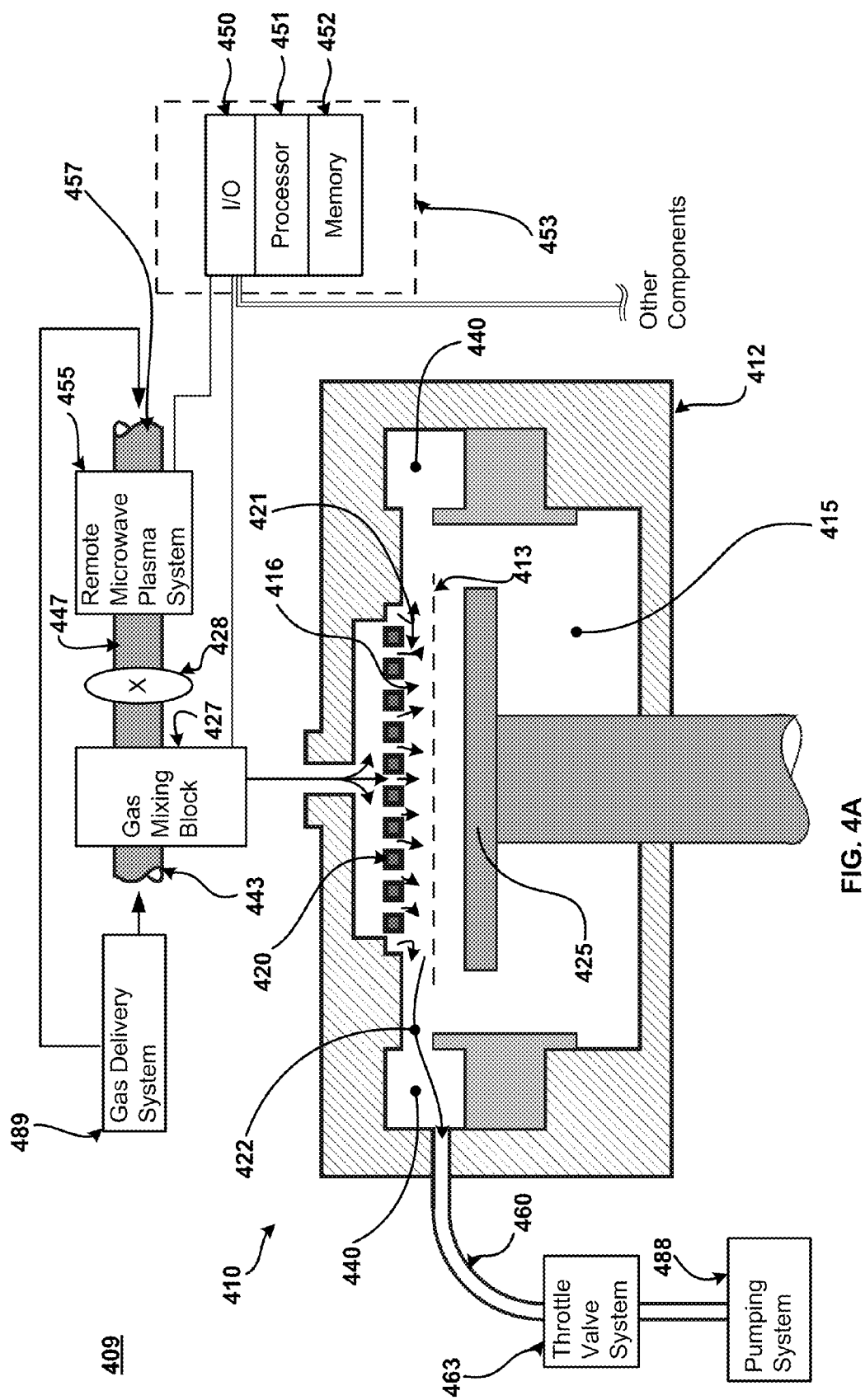
FIG. 4A shows a simplified representation of a semiconductor processing system according to embodiments of the present invention.

Having described modifications which may be made to and methods of using semiconductor processing systems according to embodiments of the present invention, attention is directed to FIG. 4A, which illustrates a simplified diagram of an exemplary semiconductor processing chamber 410 within a semiconductor processing tool 409. This system is suitable for performing a variety of semiconductor processing steps which may include CVD processes, as well as other processes, such as reflow, drive-in, cleaning, etching, and gettering processes. Multiple-step processes can also be performed on a single substrate without removing the substrate from the chamber. Representative major components of the system include a chamber interior 415 that receives process and other gases from a gas delivery system 489, pumping system 488, a remote plasma system (RPS) 455, and a control system 453. These and other components are described below in order to understand the present invention.

The semiconductor processing chamber 410 includes an enclosure assembly 412 housing a chamber interior 415 with a gas reaction area 416. A gas distribution plate 420 is provided above the gas reaction area 416 for dispersing reactive gases and other gases, such as purge gases, through perforated holes in the gas distribution plate 420 to a substrate (not shown) that rests on a vertically movable heater 425 (which may also be referred to as a substrate support pedestal). The heater 425 can be controllably moved between a lower position, where a substrate can be loaded or unloaded, for example, and a processing position closely adjacent to the gas distribution plate 420, indicated by a dashed line 413, or to other positions for other purposes, such as for an etch or cleaning process. A center board (not shown) includes sensors for providing information on the position of the substrate.

Gas distribution plate 420 may be of the variety described in U.S. Pat. No. 6,793,733. These plates improve the uniformity of gas disbursement at the substrate and are particularly advantageous in deposition processes that vary gas concentration ratios. In some examples, the plates work in combination with the vertically movable heater 425 (or movable substrate support pedestal) such that deposition gases are released farther from the substrate when the ratio is heavily skewed in one direction (e.g., when the concentration of a silicon-containing gas is small compared to the concentration of an oxidizer-containing gas) and are released closer to the substrate as the concentration changes (e.g., when the concentration of silicon-containing gas in the mixture is higher). In other examples, the orifices of the gas distribution plate are designed to provide more uniform mixing of the gases.

The heater 425 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 425 exposed within the chamber interior 415 are made of a ceramic material, such as aluminum oxide ($Al_2O_3$ or alumina) or aluminum nitride.

Reactive and carrier gases are supplied through the supply line 443 into a gas mixing box (also called a gas mixing block) 427, where they are preferably mixed together and delivered to the gas distribution plate 420. The gas mixing block 427 is preferably a dual input mixing block coupled to a process gas supply line 443 and to a cleaning/etch gas conduit 447. A valve 428 operates to admit or seal gas or plasma from the gas conduit 447 to the gas mixing block 427. The gas conduit 447 receives gases from an RPS 455, which has an inlet 457 for receiving input gases. During deposition processing, gas supplied to the plate 420 is vented toward the substrate surface (as indicated by arrows 421), where it may be uniformly distributed radially across the substrate surface, typically in a laminar flow.

Purging gas may be delivered into the chamber interior 415 through the plate 420 and/or an inlet port or tube (not shown) through a wall (preferably the bottom) of enclosure assembly 412. The purging gas flows upward from the inlet port past the heater 425 and to an annular pumping channel 440. An exhaust system then exhausts the gas (as indicated by arrow 422) into the annular pumping channel 440 and through an exhaust line 460 to a pumping system 488, which includes one or more vacuum pumps. Exhaust gases and entrained particles are drawn from the annular pumping channel 440 through the exhaust line 460 at a rate controlled by a throttle valve system 463.

The RPS 455 can produce a plasma for selected applications, such as chamber cleaning or etching native oxide or residue from a process substrate. Plasma species produced in the remote plasma system 455 from precursors supplied via the input line 457 are sent via the conduit 447 for dispersion through the plate 420 to the gas reaction area 416. Precursor gases for a cleaning application may include fluorine, chlorine, and other reactive elements. The RPS 455 also may be adapted to deposit plasma enhanced CVD films by selecting appropriate deposition precursor gases for use in the RPS 455.

The system controller 453 controls activities and operating parameters of the deposition system. The processor 451 executes system control software, such as a computer program stored in a memory 452 coupled to the processor 451. The memory 452 typically consists of a combination of static random access memories (cache), dynamic random access memories (DRAM) and hard disk drives but of course the memory 452 may also consist of other kinds of memory, such as solid-state memory devices. In addition to these memory means the semiconductor processing tool 409 in a preferred embodiment includes a floppy disk drive, USB ports and a card rack (not shown).

The processor 451 operates according to system control software programmed to operate the device according to the methods disclosed herein. For example, sets of instructions may dictate the timing, mixture of gases, chamber pressure, chamber temperature, plasma power levels, susceptor position, and other parameters of a particular process. The instructions are conveyed to the appropriate hardware preferably through direct cabling carrying analog or digital signals conveying signals originating from an input-output I/O module 450. Other computer programs such as those stored on other memory including, for example, a USB thumb drive, a floppy disk or another computer program product inserted in a disk drive or other appropriate drive, may also be used to operate the processor 451 to configure the semiconductor processing tool 409 for varied uses.

The processor 451 may have a card rack (not shown) that contains a single-board computer, analog and digital input/output boards, interface boards and stepper motor controller boards. Various parts of the semiconductor processing tool 409 conform to the Versa Modular European (VME) standard which defines board, card cage, and connector dimensions and types. The VME standard also defines the bus structure having a 16-bit data bus and 24-bit address bus.

The embodiment disclosed herein relies on direct cabling and a single processor 451. Alternative embodiments comprising multi-core processors, multiple processors under distributed control and wireless communication between the system controller and controlled objects are also possible.

Figure 4B:
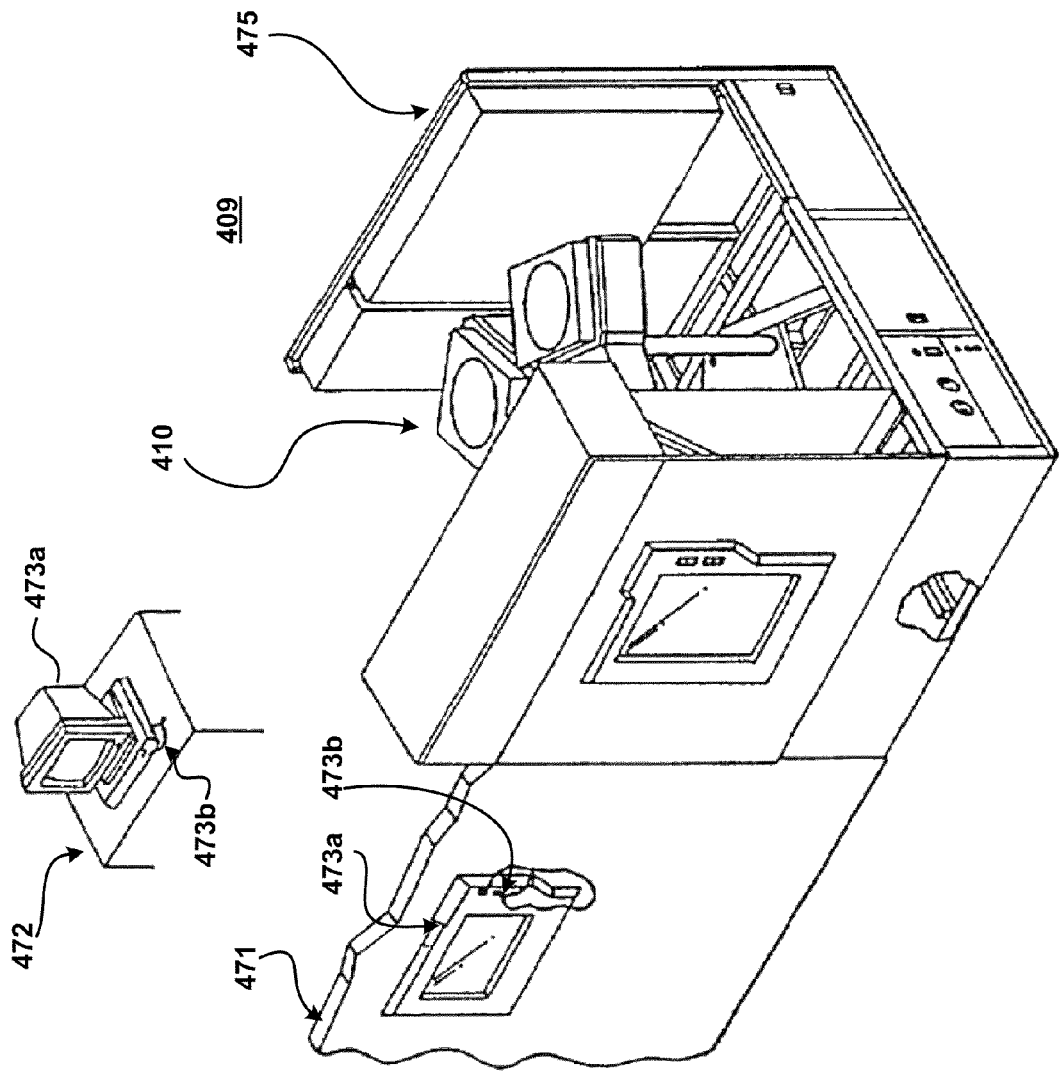
FIG. 4B shows a simplified representation of the user interface for a semiconductor processing system in relation to a processing chamber in a multi-chamber system.

FIG. 4B is a simplified diagram of a user interface in relation to the semiconductor processing chamber 410. The semiconductor processing tool 409 may include more than one processing chamber 410 as shown. Substrates may be transferred from one chamber to another for additional processing. In some cases the substrates are transferred under vacuum or a selected gas. The interface between a user and the processor is via a CRT monitor 473a (which can also be a flat panel monitor) and a pointing device 473b (which can be a light pen). A mainframe unit 475 provides electrical, plumbing, and other support functions for the processing chamber 410. Exemplary mainframe units compatible with the illustrative embodiment of the semiconductor processing system are currently commercially available as the PRECISION 5000™, the CENTURA 5200™, PRODUCER GT™ and the PRODUCER SE™ systems from APPLIED MATERIALS, INC. of Santa Clara, Calif.

In some embodiments two monitors 473a are used, one mounted in the clean room wall 471 for the operators, and the other behind the wall 472 for the service technicians. Both monitors 473a simultaneously display the same information, but only one light pen 473b is enabled. The light pen 473b detects light emitted by the CRT display with a light sensor in the tip of the pen. To select a particular screen or function, the operator touches a designated area of the display screen and pushes the button on the pen 473b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 473b to allow the user to communicate with the processor.

Figure 4C:
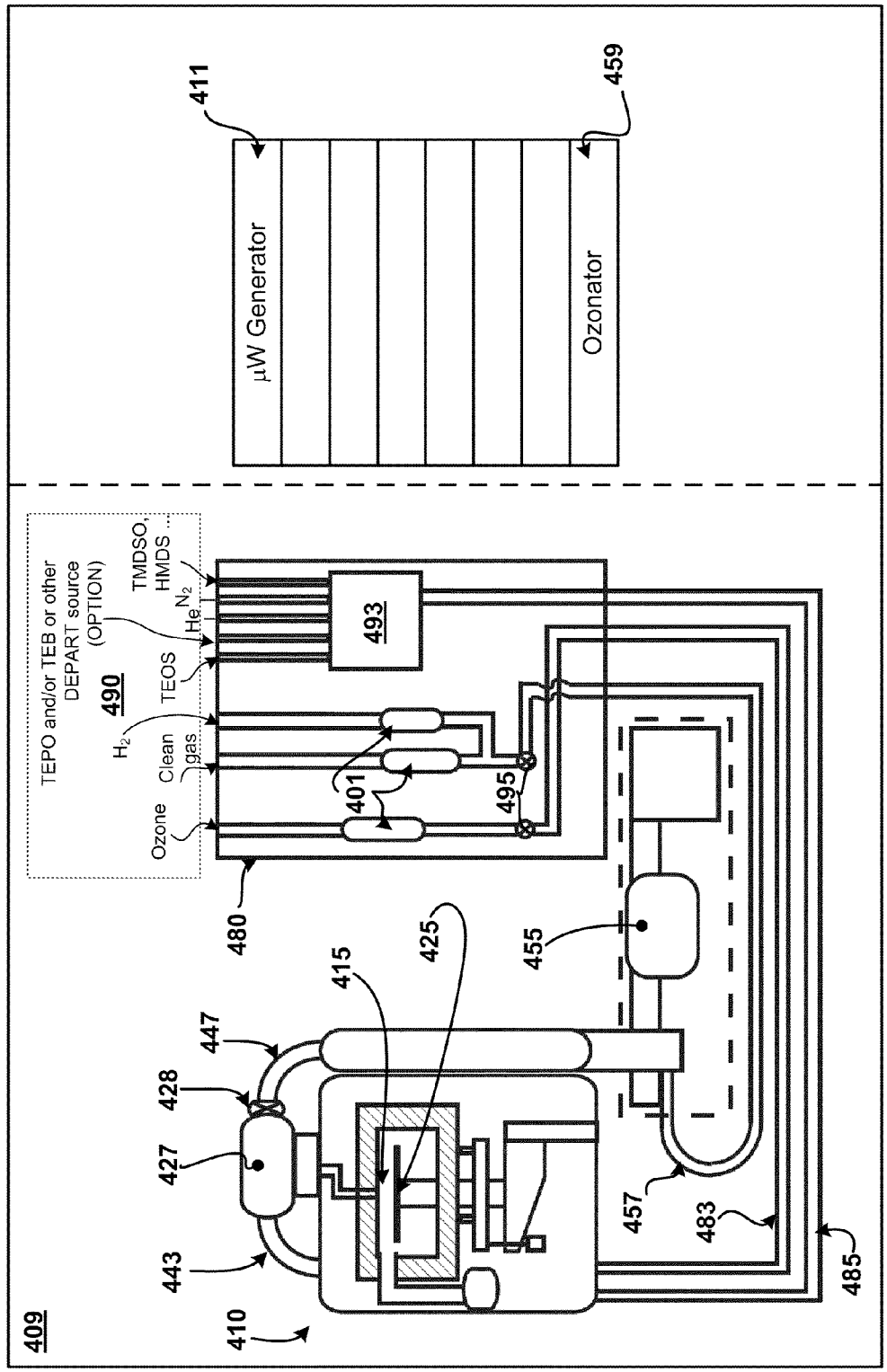
FIG. 4C shows a simplified diagram of a gas panel and supply lines in relation to a processing chamber.

FIG. 4C illustrates a general overview of an embodiment of the semiconductor processing chamber 410 in relation to a gas supply panel 480 located in a clean room. As discussed above, the semiconductor processing tool 409 includes a processing chamber 410 with a heater 425, a gas mixing box 427 with inputs from an inlet tube 443 and a conduit 447, and RPS 455 with input line 457. As mentioned above, the gas mixing box 427 is configured for mixing and injecting deposition gas(es) and cleaning gas(es) or other gas(es) through the inlet tube 443 and the input line 457 to the chamber interior 415.

The RPS 455 is integrally located and mounted below the processing chamber 410 with the conduit 447 coming up alongside the chamber 410 to the gate valve 428 and the gas mixing box 427, located above the chamber 410. Plasma power generator 411 and ozonator 459 are located remote from the clean room. Supply lines 483 and 485 from the gas supply panel 480 provide reactive gases to the gas supply line 443. The gas supply panel 480 includes lines from gas or liquid sources 490 that provide the process gases for the selected application. The gas supply panel 480 has a mixing system 493 that mixes selected gases before flow to the gas mixing box 427. In some embodiments, gas mixing system 493 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 495 that can be used to automatically or manually shut off the flow of process gas into line 485 or line 457, and (ii) liquid flow meters (LFM) 401 or other types of controllers that measure the flow of gas or liquid through the supply lines.

As an example, a mixture including TEOS as a silicon source may be used with gas mixing system 493 in a deposition process for forming a silicon oxide film. Sources of dopants such as phosphorous and boron may include TEPO and TEB which may also be introduced to gas mixing system 493. Additionally, an additive precursor such as TMDSO or HMDS may be delivered to gas mixing system 493. Precursors delivered to gas mixing system 493 may be liquid at room temperature and pressure and may be vaporized by conventional boiler-type or bubbler-type hot boxes. Alternatively, a liquid injection system may be used and offers greater control of the volume of reactant liquid introduced into the gas mixing system. The liquid is typically injected as a fine spray or mist into the carrier gas flow before being delivered to a heated gas delivery line 485 to the gas mixing block and chamber. Of course, it is recognized that other sources of dopants, silicon, oxygen and additive precursors may also be used. Though shown as an individual gas distribution line, line 485 may actually comprise multiple lines separated to discourage inter-precursor reactions before the precursors are flowed into chamber interior 415. One or more sources, such as oxygen ($O_2$), ozone ($O_3$) and/or oxygen radicals (O) flow to the chamber through another gas delivery line 483, to be combined with the reactant gases from heated gas delivery line 485 near or in the chamber.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A gas in an "excited state" describes a gas wherein at least some of the gas molecules are in vibrationally-excited, dissociated and/or ionized states. A gas may be a combination of two or more gases. The term trench is used throughout with no implication that the etched geometry necessarily has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method for forming a silicon oxide layer on a substrate in a processing chamber comprising:
    flowing a silicon-containing precursor and flowing an oxidizing gas into the processing chamber;
    flowing an additive precursor into the processing chamber, wherein the additive precursor comprises an organo-silicon compound that contains at least one Si—C bond; and
    forming the silicon oxide layer on the substrate from the silicon-containing precursor, the oxidizing gas, and the additive precursor by chemical vapor deposition, wherein the additive precursor promotes a uniform growth rate of the silicon oxide layer across the substrate and reduces roughness of the silicon oxide layer.

2. The method of claim 1 further comprising flowing water into the processing chamber.

3. The method of claim 1 wherein the substrate is a patterned substrate having a trench formed on the surface of the substrate and forming the silicon oxide layer fills the trench with silicon oxide.

4. The method of claim 1 wherein the substrate comprises a silicon surface, silicon nitride surface, and silicon oxide surface upon which the silicon oxide layer is formed.

5. The method of claim 1 wherein the silicon-containing precursor comprises tetraethylorthosilicate (TEOS), tetramethoxysilane (TMOS), or tetraethoxysilane (TRIES).

6. The method of claim 1 wherein the oxidizing gas comprises ozone ($O_3$).

7. The method of claim 1 wherein the additive precursor is a smoothing precursor.

8. The method of claim 1 wherein the organo-silicon compound is tetramethyldisiloxane (TMDSO).

9. The method of claim 1 wherein the organo-silicon compound is hexamethyldisilazane (HMDS).

10. The method of claim 1 wherein the method further comprises flowing water vapor into the processing chamber during the formation of the silicon oxide layer.

11. The method of claim 1 wherein a flow rate for the silicon-containing precursor is increased during the formation of the silicon oxide layer.

12. The method of claim 1 wherein the method further comprises adjusting a temperature of the substrate to less than 600° C.

13. The method of claim 1 wherein a pressure in the processing chamber is adjusted to below 700 torr.

14. The method of claim 8 wherein a flow rate of the organo-silicon compound is about 1 mg per minute or greater during deposition of the silicon oxide layer.

15. The method of claim 8 wherein a flow rate of the organo-silicon compound is less than or about 50 mg per minute during deposition of the silicon oxide layer.

16. The method of claim 10 wherein a flow rate of water vapor is about 3000 sccm or greater during deposition of the silicon oxide layer.

17. The method of claim 12, wherein the substrate is adjusted to a temperature range between about 300° C. and about 450° C.

18. The method of claim 12, wherein the substrate is adjusted to a temperature below about 300° C.

19. A method for filling a trench with silicon oxide wherein the trench is on a substrate within a processing chamber, the method comprising:
    flowing a first silicon-containing precursor into the processing chamber, wherein the first silicon-containing precursor comprises at least one Si—O bond;
    flowing an oxidizing precursor into the chamber;
    flowing a second silicon-containing precursor into the chamber, wherein the second silicon-containing precursor comprises at least one Si—C bond; and
    depositing the silicon oxide in the trench with the first and second silicon-containing precursors and the oxidizing precursor by chemical vapor deposition, wherein the second precursor evens out a growth rate, thereby reducing a size of voids and/or a number of voids which remain in the trench following deposition.

20. The method of claim 19 wherein the operation of flowing the first silicon-containing precursor comprises flowing tetraethylorthosilicate (TEOS).

21. The method of claim 19 wherein the operation of flowing the oxidizing precursor comprises flowing at least one precursor selected from the group consisting of ozone ($O_3$), oxygen ($O_2$) and oxygen radicals (O).

22. The method of claim 19 wherein the method further comprises flowing water vapor into the processing chamber during the formation of the silicon oxide layer.

23. The method of claim 19 wherein the second silicon-containing precursor comprises tetramethyldisiloxane (TMDSO).

24. The method of claim 19 wherein flowing the second silicon-containing precursor comprises flowing tetramethyldisiloxane (TMDSO) at a flow rate greater than about 1 mg per minute during deposition of the silicon oxide.

25. The method of claim 19 wherein the second silicon-containing precursor comprises hexamethyldisilazane (HMDS).

26. The method of claim 19 wherein flowing the second silicon-containing precursor comprises flowing hexamethyldisilazane (HMDS) at a flow rate greater than about 1 mg per minute during deposition of the silicon oxide.

27. The method of claim 20 wherein a flow rate of TEOS is about 1 gm per minute or greater during deposition of the silicon oxide.

28. The method of claim 23 wherein the flow rate of the second silicon-containing precursor increases during deposition of the silicon oxide.

29. The method of claim 25 wherein the flow rate of the second silicon-containing precursor increases during deposition of the silicon oxide.

* * * * *

UNITED STATES PATENT AND TRADEMARK OFFICE
CERTIFICATE OF CORRECTION

| | | |
|---|---|---|
| PATENT NO. | : 8,012,887 B2 | Page 1 of 1 |
| APPLICATION NO. | : 12/489234 | |
| DATED | : September 6, 2011 | |
| INVENTOR(S) | : Venkataraman et al. | |

It is certified that error appears in the above-identified patent and that said Letters Patent is hereby corrected as shown below:

In the Specification:

Column 1, line 10, please delete "19, 2008" and insert --18, 2008--.

Signed and Sealed this

Eighteenth Day of October, 2011

David J. Kappos
*Director of the United States Patent and Trademark Office*